(12) United States Patent
Kim et al.

(10) Patent No.: US 7,093,178 B2
(45) Date of Patent: Aug. 15, 2006

(54) APPARATUS AND METHOD FOR TRANSMITTING AND RECEIVING DATA IN A CDMA MOBILE COMMUNICATION SYSTEM

(75) Inventors: Noh-Sun Kim, Taejon-Kwangyokshi (KR); Yong-Suk Moon, Songnam-shi (KR); Hun-Kee Kim, Seoul (KR); Jae-Seung Yoon, Songnam-shi (KR)

(73) Assignee: Samsung Electronics Co., Ltd., (KR)

( * ) Notice: Subject to any disclaimer, the term of this patent is extended or adjusted under 35 U.S.C. 154(b) by 482 days.

(21) Appl. No.: 10/174,147

(22) Filed: Jun. 18, 2002

(65) Prior Publication Data

US 2002/0199147 A1 Dec. 26, 2002

(30) Foreign Application Priority Data

Jun. 18, 2001 (KR) .............................. 2001-34488

(51) Int. Cl.
*G08C 25/02* (2006.01)
(52) U.S. Cl. ........................................ 714/748; 714/786
(58) Field of Classification Search .................... None
See application file for complete search history.

(56) References Cited

U.S. PATENT DOCUMENTS

| 4,747,104 A | | 5/1988 | Piret | |
|---|---|---|---|---|
| 5,105,442 A | * | 4/1992 | Wei | ............................ 375/262 |
| 5,450,453 A | | 9/1995 | Frank | |

FOREIGN PATENT DOCUMENTS

| EP | 0 485 108 A2 | 10/1991 |
|---|---|---|
| EP | 1 043 858 A1 | 10/2000 |
| EP | 1 189 380 A2 | 3/2002 |
| JP | 2002-199037 | 7/2002 |
| WO | WO 99/17509 | 4/1999 |

OTHER PUBLICATIONS

Panasonic, "Enhanced HARQ Method with Signal Constellation Rearrangement", Mar. 2, 2001, TSG-RAN Working Group 1 Meeting #19.*
Examination Report dated Jul. 10, 2003 issued in Application No. GB 0213803.0.
Samsung Electronics Co., "Enhanced Symbol Mapping Method for the Modulation of Turbo-Coded Bits Based on Bit Priority", 3GPP TSG RAN WG1/WG2 Joint Meeting on HSDPA, Sopia Antipolis, FR, Apr. 5-6, 2001.
Panasonic, "Enhanced HARQ Method with Signal Constellation Rearrangement", TSG-RAN Working Group 1, Meeting #19, Las Vegas, USA, Feb. 27-Mar. 2, 2001.
3$^{rd}$ Generation Partnership Project; Technical Specification Group Radio Access Network; Physical Layer Aspects of UTRA High Speed Downlink Packet Access, Release 4, Mar. 2001.
Examination Report dated Jan. 8, 2004 issued in a counterpart application, namely Appln. No. GB0326353.0.

* cited by examiner

*Primary Examiner*—Albert Decady
*Assistant Examiner*—John P. Trimmings
(74) *Attorney, Agent, or Firm*—Dilworth & Barrese, LLP

(57) ABSTRACT

Disclosed is a method for transmitting data comprised of bits with higher priority and bits with lower priority output from a coder, using a high-order modulator in which a bit stream comprised of at least 3 bits represents one symbol and includes a first bit part with higher reliability and a second bit part with lower reliability. The method comprises modulating the bits with higher priority and the bits with lower priority such that the bits with higher priority are mapped to the first bit part and the bits with lower priority are also mapped to the first bit part at initial transmission; and modulating the bits with higher priority and the bits with lower priority such that the bits with higher priority are mapped to the second bit part and the bits with lower priority are mapped to the first bit part at retransmission.

12 Claims, 12 Drawing Sheets

APPARATUS AND METHOD FOR TRANSMITTING AND RECEIVING DATA IN A CDMA MOBILE COMMUNICATION SYSTEM

This application claims priority to an application entitled "Apparatus and Method for Transmitting and Receiving Data in a CDMA Mobile Communication System" filed in the Korean Industrial Property Office on Jun. 18, 2001 and assigned Serial No. 2001-34488, the contents of which are hereby incorporated by reference.

BACKGROUND OF THE INVENTION

1. Field of the Invention

The present invention relates generally to an apparatus and method for transmitting and receiving data in a CDMA mobile communication system, and in particular, to a data transmission/reception apparatus and method for adjusting the reliability of data bits before transmission and weight-combining received data bits according to the reliability of received data bits to improve system performance.

2. Description of the Related Art

In a communication system, it is impossible to receive transmission signals without any distortion and noises mixed therein. In particular, a mobile communication system transmitting and receiving signals via a wireless network is more susceptible to the distortion and noises, compared with a wired communication system.

For this reason, there have been proposed various methods of reducing the influence of the distortion and noises on the mobile communication system. For example, in order to reduce a bit error rate from $10^{-2}$ to $10^{-3}$ in an AWGN (Additive White Gaussian Noise) environment using the typical modulation technique and coding technique, a low signal-to-noise ratio (SNR) of about 1 dB to 2 dB is required. On the other hand, in order to obtain the same results in a multipath fading environment, it is necessary to increase the signal-to-noise ratio to about 10 dB. However, a method of increasing transmission power in order to increase the signal-to-noise ratio for a reduction in the bit error rate may undesirably decrease the entire system performance. Therefore, a technique for effectively reducing or removing the influence of fading, i.e., the influence of distortion or noises, without additional power or a loss of bandwidth in both a UE (User Equipment) and a Node B is very important to the mobile communication system. One of the effective technique for this is a channel interleaving technology combined with an error control coding technique.

The channel interleaving technology interleaves transmission data bits before transmission to disperse the transmission data from a portion of a signal where data bits may be possibly damaged to different places instead of concentrating the portion on one place. That is, the interleaving technology prevents a burst error by allowing adjacent bits to be randomly affected by fading.

Meanwhile, codes used for the error control coding technique are divided into a memoryless code and a memory code. The memoryless code includes a linear block code, while the memory code includes a convolutional code and a turbo code. Further, a device for performing coding by the error control coding technique is called a "channel coder".

In particular, a future mobile communication system requires reliable transmission of high-speed multimedia data, so it needs a more powerful channel coding technique. A channel coding technique using the turbo code shows performance nearest to the Shannon limit with respect to the bit error rate (BER) even in the low signal-to-error ratio. An output of a channel coder using the turbo code can be divided into systematic bits and parity bits. Here, the "systematic bits" refer to actual information data bits to be transmitted, while the "parity bits" refer to bits added to help a receiver correct a possible transmission error. However, even the error control coded signals cannot overcome a possible burst error occurring in the systematic bits or the parity bits.

Of course, the systematic bits and the parity bits output from the channel coder have different priorities. In other words, in the case where errors occur in transmission data at a given rate, it is possible to perform more correct decoding when the errors occur in the parity bits, compared with when the errors occur in the systematic bits. The reason is because, as stated above, the systematic bits are the actual information data bits, while the parity bits are the bits added to assist the receiver to correct transmission errors in decoding process.

The SMP (Symbol Mapping method based on Priority) technique can increases system performance by decreasing the probability that errors will occur in the systematic bits having higher priority than the parity bits. The SMP technique uses two interleavers at an output stage of the channel coder to map the systematic bits and the parity bits to the bits having different reliabilities. That is, an existing transmitter not employing the SMP technique interleaves the systematic bits and the parity bits together without discrimination before transmission. However, a transmitter employing the SMP technique separately interleaves the systematic bits and the parity bits, and then maps during modulation the bits having higher priority to a bit position having higher reliability and the bits having lower priority to a bit position having lower reliability. As a result, when transmitted by the SMP technique, the bits having higher priority have a lower bit error rate than the bits having lower priority, contributing to an increase in an error correcting capability by the receiver during decoding process.

FIG. 1 illustrates a signal constellation diagram for 16QAM (16-ary Quadrature Amplitude Modulation) modulation, and FIG. 2 illustrates a signal constellation diagram for 64QAM (64-ary Quadrature Amplitude Modulation) modulation.

Referring to FIG. 1, 16QAM-modulated symbols are each comprised of 4 bits, and have a reliability pattern [H,H,L,L], where H represents a bit position having higher reliability and L represents a bit position having lower reliability. That is, the leading two bits have higher reliability and the following two bits have lower reliability.

Referring to FIG. 2, 64QAM-modulated symbols are each comprised of 6 bits, and have a reliability pattern [H,H,M, M,L,L], where H represents a bit position having higher reliability, M represents a bit position having medium reliability and L represents a bit position having lower reliability.

Therefore, it is possible to map the interleaved systematic bits and parity bits to the bit positions with higher reliability, the bit positions with medium reliability and the bit positions with lower reliability according to systematic bits and priority bits priorities. Based on this, the SMP technique maps the systematic bits to the bit positions with higher reliability, resulting in an improvement in frame error rate (FER) during transmission. Here, as to the reliability, in a process of modulating one symbol by the transmitter, the symbol expressing two bits in a macro region like the left/right quadrants or upper/lower quadrants on the X/Y-axis of FIGS. 1 and 2 is said to have "higher reliability", and the symbol expressing two bits in a micro region is said to have "lower reliability".

FIG. 3 illustrates a structure of a transmitter constituting an HSDPA (High-Speed Downlink Packet Access) wireless communication system employing the SMP technique.

Referring to FIG. 3, tail bits are added to transmission data in the tail bit generator 111. transmission data is separated into systematic bits and parity bits by a channel coder 112, and then subjected to rate matching through a rate matcher 114. The rate-matched systematic bits and parity bits are provided to a distributor 116. The distributor 116 distributes the systematic bits with higher priority to a first interleaver 118 and the parity bits with lower priority to a second interleaver 120. The systematic bits interleaved by the first interleaver 118 and the parity bits interleaved by the second interleaver 120 are output in series through a parallel-to-serial converter 122, and then provided to a modulator 124. The modulator 124 maps before transmission to the receiver the systematic bits to the bit positions having higher reliability and the parity bits to the symbol positions having lower reliability. The transmitter of FIG. 3 is under the control of controller 126.

As described above, the SMP technique maps the systematic bits having higher priority to the bit positions with higher reliability, thus contributing to an improvement in FER during high-speed downlink packet transmission.

Meanwhile, since the future mobile communication system needs reliable transmission of high-quality, high-efficiency, high-capacity and high-speed multimedia data, it is necessary to link the SMP technique to the high-speed downlink packet transmission. However, when the SMP technique is employed in a system using a H-ARQ (Hybrid Automatic Repeat Request) technique, it is assumed that the bits having higher priority are mapped to the bit positions having higher reliability even at retransmission. In this case, the effect of a coding gain may be reduced, because decoding performance of a turbo decoder is improved when its input bits have a homogeneous LLR (Log Likelihood Ratio). The present invention provides a technique capable of obtaining both the coding effect and a diversity gain, and also capable of using the characteristic of the turbo decoder, in a system using the H-ARQ technique.

SUMMARY OF THE INVENTION

It is, therefore, an object of the present invention to provide a data transmission/reception apparatus and method for improving performance of a wireless communication system.

It is another object of the present invention to provide an apparatus and method for effectively transmitting and receiving data by linking SMP technique to an H-ARQ technique.

It is further another of the present invention to provide an apparatus and method for obtaining the effect of a diversity gain or a coding gain by adaptively assigning priorities to transmission bits in a transmitter for a wireless communication system.

It is yet another object of the present invention to provide a data transmission/reception apparatus and method for maximizing a coding gain by mapping a systematic bit to a bit position with higher reliability at initial transmission and mapping a parity bit to a bit position with higher reliability at retransmissions, for the same bits, in a wireless communication system.

It is still another object of the present invention to provide a data transmission/reception apparatus and method for increasing decoding probability by mapping a systematic bit to a bit position with higher reliability at initial transmission and then alternately mapping a parity bit and a systematic bit to a bit position with higher reliability at retransmissions, to average LLR values for input bits of a channel decoder.

It is still another object of the present invention to provide a data transmission/reception apparatus and method for performing effective decoding by applying a weight to decoded bits based on reliability of retransmitted signals during combining.

According to a first aspect of the present invention, there is provided a method for transmitting data comprised of bits with higher priority and bits with lower priority output from a coder, using a high-order modulator in which a bit stream comprised of at least 3 bits represents one symbol and includes a first bit part with higher reliability and a second bit part with lower reliability. The method comprises modulating the bits with higher priority and the bits with lower priority such that the bits with higher priority are mapped to the first bit part and the bits with lower priority are also mapped to the first bit part at initial transmission; and modulating the bits with higher priority and the bits with lower priority such that the bits with higher priority are mapped to the second bit part and the bits with lower priority are mapped to the first bit part at retransmission.

According to a second aspect of the present invention, there is provided a method for retransmitting data comprised of bits with higher priority and bits with lower priority output from a coder, using a high-order modulator in which a bit stream comprised of at least 3 bits represents one symbol and includes a first bit part with higher reliability and a second bit part with lower reliability. The method comprises assigning reliabilities of the bits with higher priority and the bits with lower priority at a retransmission request; and modulating the bits with higher priority and the bits with lower priority such that the bits with higher priority and the bits with lower priority are mapped to the first bit part and the second bit part according to the assigned reliabilities.

According to a third aspect of the present invention, there is provided a transmission apparatus in a CDMA (Code Division Multiple Access) mobile communication system. The transmission apparatus comprises a turbo coder for receiving a stream of data bits, and generating a stream of information bits and a stream of parity bits for error correcting; an interleaver for interleaving the information bits and the parity bits from the turbo coder, and generating an interleaved information bit stream and an interleaved parity bit stream; and a modulator for modulating M information symbols, each information symbol including a bit region with higher reliability and a bit region with lower reliability, for mapping the interleaved information bit stream to the bit region with higher reliability and the interleaved parity bit stream to the bit region with lower reliability at initial transmission, and for mapping the interleaved parity bit stream to the bit region with higher reliability and the interleaved information bit stream to the bit region with lower reliability at a retransmission request.

According to a fourth aspect of the present invention, there is provided an apparatus for retransmitting data comprised of bits with higher priority and bits with lower priority output from a coder, using a high-order modulator in which a bit stream comprised of at least 3 bits represents one symbol and includes a first bit part with higher reliability and a second bit part with lower reliability. The apparatus comprises a reliability decision part for assigning reliabilities of the bits with higher priority and the bits with lower priority at a retransmission request; and a modulator for modulating the bits with higher priority and the bits with lower priority such that the bits with higher priority and the bits with lower priority are mapped to the first bit part and the second bit part according to the assigned reliabilities.

According to a fifth aspect of the present invention, there is provided a method for receiving data in which a bit stream comprised of at least 3 bits represents one symbol and includes a first bit part with higher reliability and a second bit part with lower reliability. The method comprises demodulating coded bits existing in the first bit part and coded bits existing in the second bit part at initial transmission; modulating the coded bits existing in the first bit part and the coded bits existing in the second bit part at retransmission; applying a weight to the coded bits demodulated at initial transmission and at least one of retransmissions according to the reliabilities, and combining the same coded bits; and sending a retransmission request according to whether an error has occurred in the information bits decoded by the combined coded bits.

According to a sixth aspect of the present invention, there is provided an apparatus for receiving data in which a bit stream comprised of at least 3 bits represents one symbol and includes a first bit part with higher reliability and a second bit part with lower reliability. The apparatus comprises a demodulator for demodulating coded bits existing in the first bit part and coded bits existing in the second bit part at initial transmission or retransmission; a buffer for temporarily storing the coded bits demodulated by the demodulator at the initial transmission and retransmission at a retransmission request; a weight-combiner for applying a weight to coded bits stored in the buffer according to the reliabilities and the coded bits demodulated by the demodulator at the retransmission request, and combining the same coded bits; a channel decoder for decoding the coded bits combined by the weighted combiner into information bits; and a CRC (Cyclic Redundancy Check) checker for checking whether an error has occurred in the information bits from the channel decoder, and transmitting the retransmission request according to the CRC check results.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
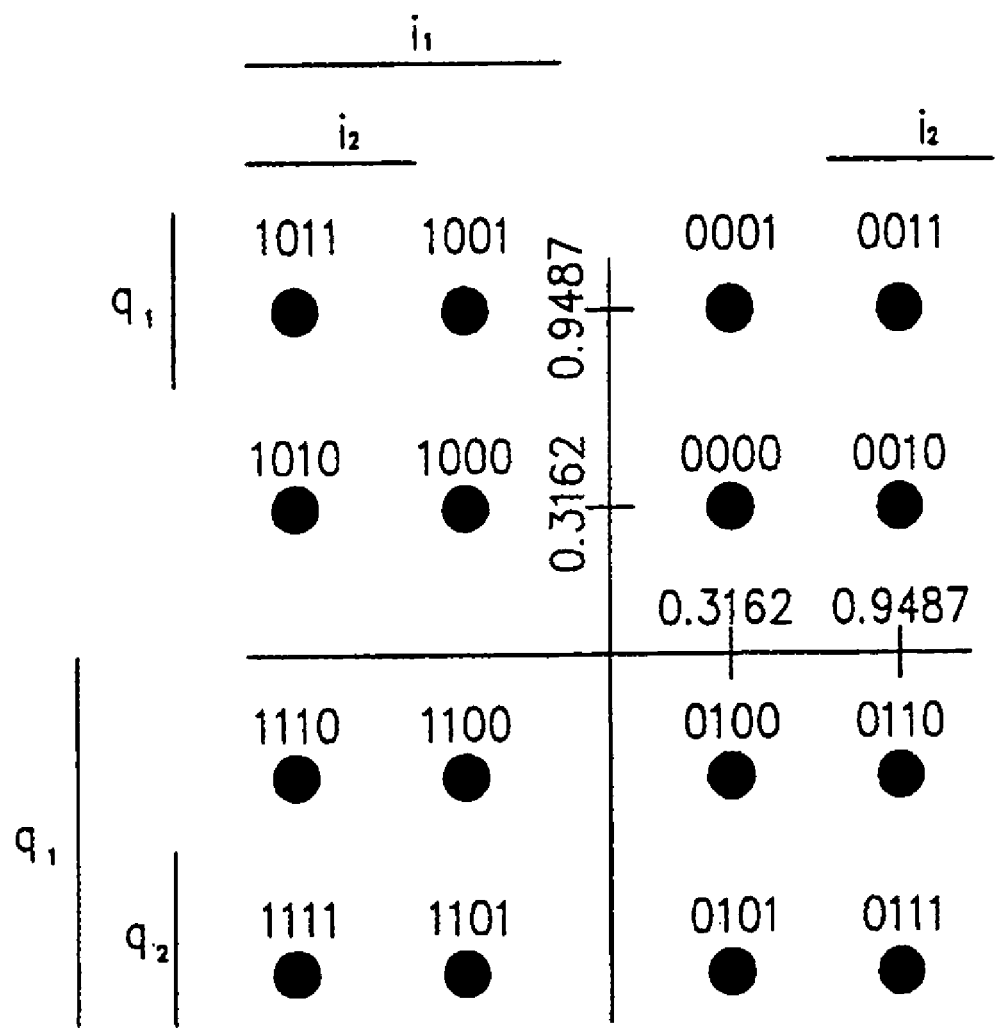
FIG. 1 illustrates a signal constellation diagram for 16QAM modulation in a CDMA mobile communication system.
Figure 2:
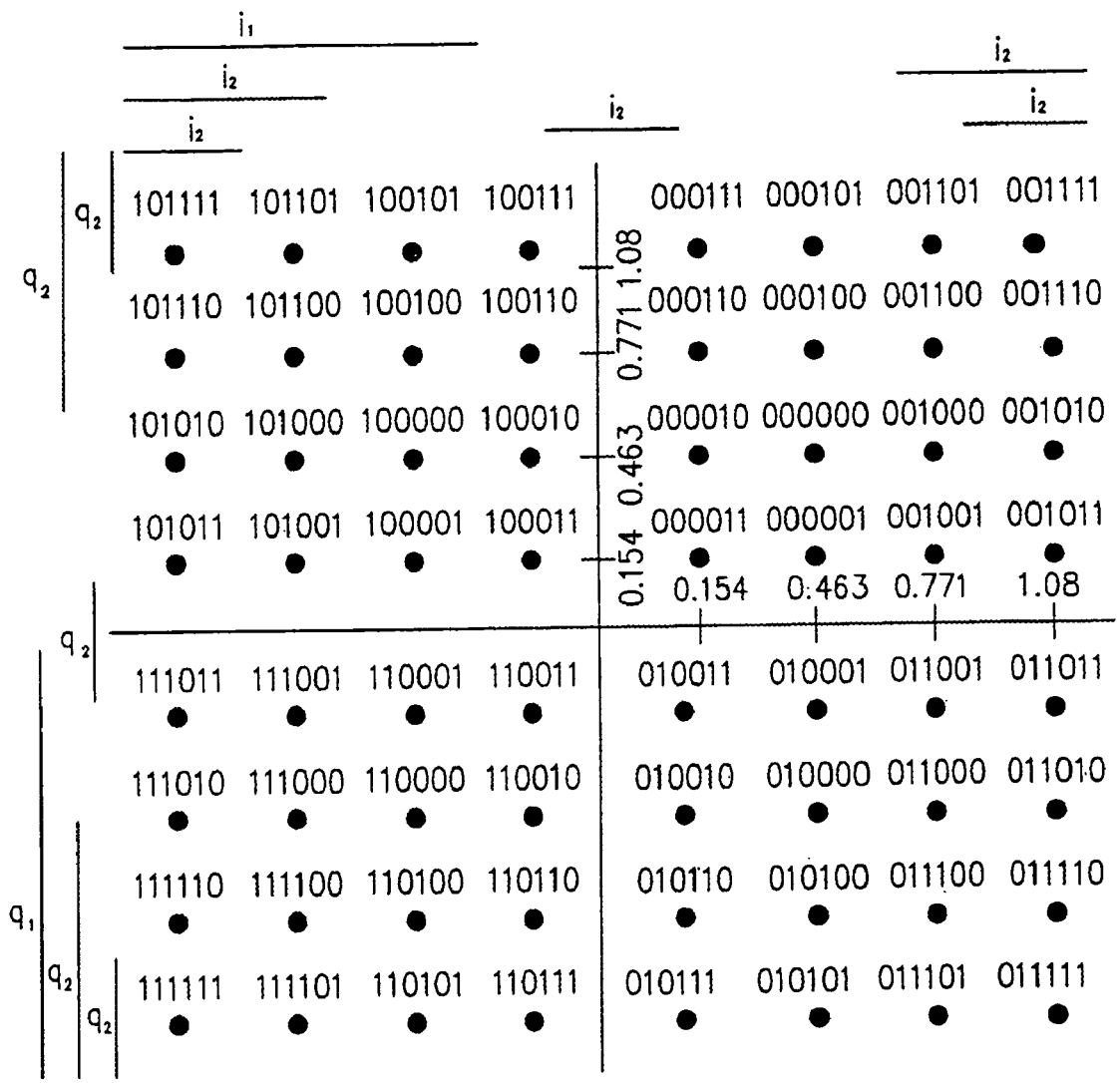
FIG. 2 illustrates a signal constellation diagram for 64QAM modulation in a CDMA mobile communication system.
Figure 3:
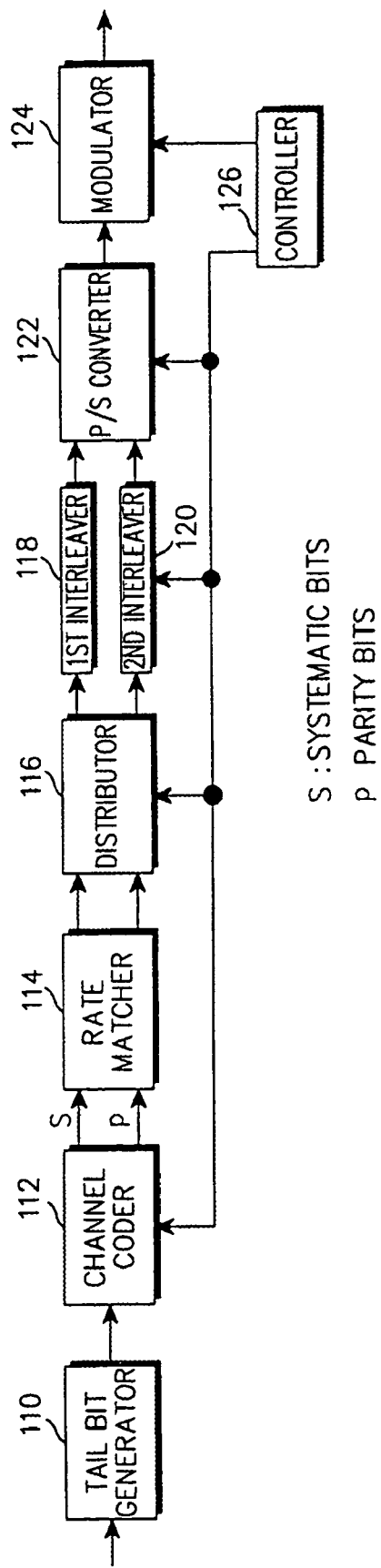
FIG. 3 illustrates a structure of a transmitter using an SMP (Symbol Mapping method based on Priority) technique in a CDMA mobile communication system.

A preferred embodiment of the present invention will be described herein below with reference to the accompanying drawings. In the following description, well-known functions or constructions are not described in detail since they would obscure the invention in unnecessary detail.

In the following description, it will be assumed that a channel coder supports coding rates of ½ and ¾, and 16QAM modulation is selected among QPSK (Quadrature Phase Shift Keying), 8PSK (8-ary Phase Shift Keying), 16QAM and 64QAM modulations. In the case of a coding rate ½ (symmetrical coding rate), the channel coder receives 1 bit and outputs 2 bits. Of the 2 output bits, 1 bit is a systematic bit which is an actual information data bit, and the remaining 1 bit is a parity bit for detecting or correcting an error. In the case of a coding rate ¾ (asymmetrical coding rate), the channel coder receives 3 bits and outputs 4 bits. The output bits are comprised of 3 systematic bits and 1 parity bit.

Meanwhile, 16QAM-modulated symbols have a reliability pattern [H,H,L,L], and 64QAM-modualted symbols have a reliability pattern [H,H,M,M,L,L], where H represents a bit position having higher reliability, M represents a bit position having medium reliability and L represents a bit position having lower reliability. The present invention aims at mapping a bit having higher priority (e.g., systematic bit and tail bit) to a bit position with higher reliability, and a bit with lower priority (e.g., parity bit and tail parity bit) to a bit position with lower reliability, according to priorities of coded bits. Also, the reliability patterns noted above can be changed or modified according to system characteristics.

The H-ARQ (Hybrid Automatic Repeat Request) to be linked to the SMP technique according to the present invention is a link control technique for correcting an error by retransmitting the errored data upon occurrence of a packet error. The H-ARQ is classified into H-ARQ Type II and H-ARQ Type III according to whether to retransmit information bits. Typically, Full Incremental Redundancy (FIR) represents the H-ARQ Type II. Further, the H-ARQ Type II is divided into Chase Combing (CC) and Partial Incremental Redundancy (PIR) according to whether parity bits used for retransmission are identical to each other. Herein, a description of the embodiment of the present invention will be made separately with reference to the H-ARQ Type II and the H-ARQ Type III.

Figure 4:
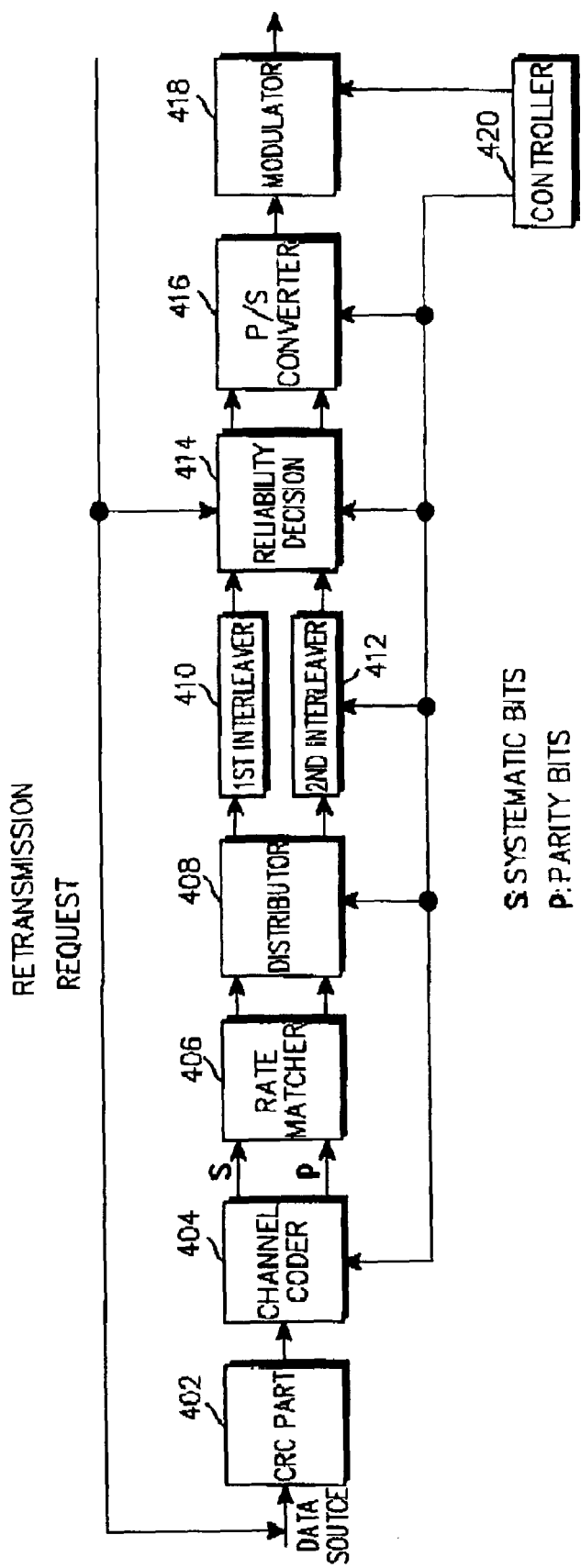
FIG. 4 illustrates a structure of a transmitter in a CDMA mobile communication system according to an embodiment of the present invention.
Figure 5:
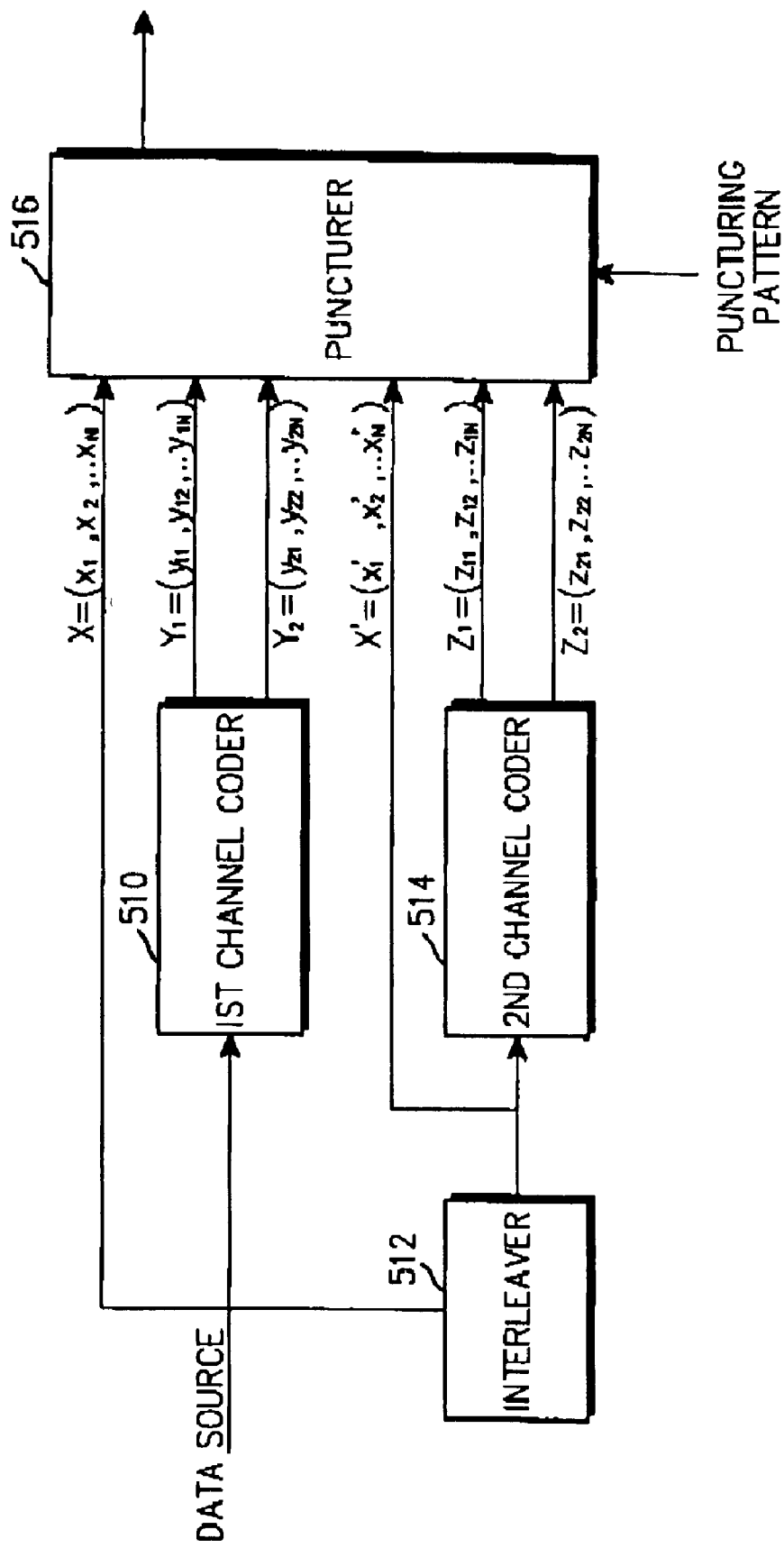
FIG. 5 illustrates a detailed structure of the channel coder shown in FIG. 4.

FIG. 4 illustrates a structure of a transmitter in a CDMA mobile communication system according to an embodiment of the present invention. Referring to FIG. 4, a CRC (Cyclic Redundancy Check) part 402 receives transmission data source, and adds CRC for error checking on the received data. A channel coder 404 receives the CRC-added data, and codes the received data using a prescribed code. The "prescribed code" refers to a code for outputting transmission bits and error control bits for the transmission bits by coding the received data. For example, the transmission bits become systematic bits (S), and the error control bits become parity bits (P). The prescribed code, as mentioned above, includes a turbo code and a systematic convolutional code. Meanwhile, the channel coder codes data at a prescribed coding rate. The prescribed coding rate determines a ratio of systematic bits to parity bits output from the channel coder 404. For example, if the prescribed coding rate is a symmetrical coding rate of ½, the channel coder 404 receives 1 bit, and outputs 1 systematic bit and 1 parity bit. However, if the prescribed coding rate is an asymmetrical coding rate of ¾, the channel coder 404 receives 3 bits, and outputs 3 systematic bits and 1 parity bit. Herein, a description of the invention will be made separately for the coding rates ½ and ¾. A detailed structure of the channel coder 404 is illustrated in FIG. 5.

A rate matcher 406 performs rate matching through repetition and puncturing on the coded bits from the channel coder 404. A distributor 408 receives the systematic bits and the parity bits from the rate matcher 406, and distributes the systematic bits and the parity bits to a plurality of interleavers. For example, when the interleavers include a first interleaver 410 and a second interleaver 412, the distributor 408 distributes the systematic bits and the parity bits into two bit groups having the same number of bits. That is, in the case of the asymmetrical coding rate ¾, the distributor 408 distributes 2 systematic bits to a first interleaver 410, and the remaining 1 systematic bit and the 1 parity bit to a second interleaver 412. However, in the case of the symmetrical coding rate ½, since the number of the systematic bits is equal to the number of the parity bits, the distributor 408 distributes the systematic bits to the first interleaver 410 and the parity bits to the second interleaver 412.

The first interleaver 410 and the second interleaver 412 receive the coded bits from the distributor 408, and interleave the received coded bits. The coded bits may include the systematic bits, the parity bits, or a combination of the systematic bits and the parity bits.

A reliability decision part 414 receives the coded bits from the first interleaver 410 and the second interleaver 412, and decides reliabilities to be assigned to the received coded bits. Here, the reliability decision part 414 should previously recognize a reliability decision pattern based on the H-ARQ and the coding rate in use. Various examples of the reliability decision pattern are illustrated in FIGS. 7 to 12. Further, the reliability decision part 414 outputs the coded bits according to the decided reliabilities. For example, the reliability decision part 414 decides higher reliability for the systematic bits and lower reliability for the parity bits, at initial transmission. However, at retransmission caused by a retransmission request, the reliability decision part 414 according to the present invention decides the reliability in a different manner, as follows. In a first method, the reliability decision part 414 decides higher reliability for the parity bits and lower reliability for the systematic bits, at retransmission. In a second method, the reliability decision part 414 alternately decides the reliabilities for the systematic bits and the parity bits at every other retransmission. For example, the reliability decision part 414 decides higher reliability for the parity bits at odd-numbered retransmission, and decides higher reliability for the systematic bits at even-numbered retransmission. The retransmission is performed by a retransmission command from an upper layer (not shown) that has received a retransmission request received from a receiver. In addition, the reliability decision part 414 differently decides the reliabilities according to the H-ARQ types.

A parallel-to-serial (P/S) converter 416 receives in parallel the coded bits output from the reliability decision part 414 and outputs the received bits in series. For example, the P/S converter 416 preferentially outputs the coded bits, for which higher reliability is decided by the reliability decision part 414, and then consecutively outputs the coded bits, for which lower reliability is decided by the reliability decision part 414. This is to map the coded bits decided to have higher reliability to the bit positions with higher reliability in a modulation operation performed later.

A modulator 418 maps the coded bits from the P/S converter 416 to prescribed symbols and transmits the mapped coded bits to the receiver. For example, when using the 16QAM modulation, the modulator 418 maps the coded bits to the symbols having a bit reliability pattern [H,H,L,L].

A controller 420 controls the overall operation of the transmitter according to an embodiment of the present invention. The controller 420 first determines a coding rate and a modulation mode to be used according to the current radio channel state. The controller 420 controls a coding rate of the channel coder 404 according to the determined coding rate, and also controls the modulator 418 according to the determined modulation mode. In addition, the controller 420 controls a distribution pattern of the distributor 408 according to the determined coding rate and modulation mode.

Although the reliability decision part 414 and the P/S converter 416 are separately constructed in FIG. 4, they can be unified into one structure in an alternative embodiment. In this case, a new reliability decision section receives the coded bits from the first interleaver 410 and the second interleaver 412, decides reliabilities to be assigned to the respective coded bits, and sequentially outputs the coded bits according to the assigned reliabilities. The new reliability decision section preferentially outputs the coded bits assigned higher reliability on a bit-by-bit basis, and then consecutively outputs the coded bits assigned lower reliability on a bit-by-bit basis. That is, the new reliability decision section outputs the coded bits in series.

Alternatively, the same operation can be implemented using only the P/S converter of FIG. 4. In this case, the P/S converter receives the coded bits from the first interleaver 410 and the second interleaver 412, preferentially outputs the coded bits to be assigned higher reliability, and then outputs the coded bits to be assigned lower reliability.

Although the transmitter of FIG. 4 separately includes the reliability decision part 414 for deciding reliabilities of the coded bits at initial transmission and retransmission, the distributor 408 can decide the reliabilities before interleaving the coded bits in an alternative embodiment. That is, the distributor 408 decides reliabilities for the coded bits received according to a prescribed reliability decision pattern, and then distributes the coded bits to the first interleaver 410 and the second interleaver 412 according to the decided reliabilities. In this case, the reliability decision part 414 of FIG. 4 is unnecessary. In this structure, the retransmission command from the upper layer should be provided to the distributor 408.

FIG. 5 illustrates a detailed structure of the channel coder 404 shown in FIG. 4. The channel coder of FIG. 5 uses an R=⅙ code adopted in 3GPP (3$^{rd}$ Generation Partnership Project).

Referring to FIG. 5, upon receiving one transmission frame, the channel coder outputs the intact transmission frame as a systematic bit frame X. The transmission frame is also provided to a first channel coder 510, and the first channel coder 510 performs coding on the transmission frame and outputs two different parity bit frames $Y_1$ and $Y_2$.

In addition, the transmission frame is also provided to an interleaver 512, and the interleaver 512 interleaves the transmission frame. The intact interleaved transmission frame is transmitted as an interleaved systematic bit frame X'. The interleaved transmission frame is provided to a second channel coder 514, and the second channel coder 514 performs coding on the interleaved transmission frame and outputs two different parity frames $Z_1$ and $Z_2$.

The systematic bit frame X is comprised of a transmission unit of $x_1, x_2, \ldots, x_N$, and the interleaved systematic bit frame X' is comprised of a transmission unit of $x'_1, x'_2, \ldots, x'_N$. The parity bit frame $Y_1$ is comprised of a transmission unit of $y_{11}, y_{12}, \ldots, y_{1N}$, and the parity bit frame $Y_2$ is comprised of a transmission unit of $y_{21}, y_{22}, \ldots, y_{2N}$. Finally, the parity bit frame $Z_1$ is comprised of a transmission unit of $z_{11}, z_{12}, \ldots, z_{1N}$, and the parity bit frame $Z_2$ is comprised of a transmission unit of $z_{21}, z_{22}, \ldots, z_{2N}$.

The systematic bit frame X, the interleaved systematic bit frame X', and the four different parity bit frames $Y_1, Y_2, Z_1$ and $Z_2$ are provided to a puncturer 516. The puncturer 516 punctures the systematic bit frame X, the interleaved systematic bit frame X', and the four different parity bit frames $Y_1, Y_2, Z_1$ and $Z_2$ according to a puncturing pattern provided from the controller (AMCS) 420, and exclusively outputs desired systematic bits S and parity bits P. Here, the puncturing pattern is determined according to a coding rate of the channel coder 404 and the H-ARQ type in use. Exemplary puncturing patterns are defined as $$P_1 = \begin{bmatrix} 1 & 1 \\ 1 & 0 \\ 0 & 0 \\ 0 & 0 \\ 0 & 0 \\ 0 & 1 \end{bmatrix} \quad \text{Equation (1)}$$

$$P_2 = \begin{bmatrix} 1 & 1 \\ 1 & 0 \\ 0 & 0 \\ 0 & 0 \\ 0 & 1 \\ 0 & 0 \end{bmatrix} \quad \text{Equation (2)}$$

The exemplary puncturing patterns of Equations (1) and (2) are used when the H-ARQ Type III (CC and PIR) is used and the channel coder 404 has a coding rate ½. If the H-ARQ Type II (FIR) is used, the puncturer 516 must use a puncturing pattern for puncturing the systematic bits at retransmission. For example, a puncturing pattern for the H-ARQ Type II will become "010010".

If it is assumed that the puncturer 516 uses the puncturing pattern of Equation (1), the puncturer 516 outputs X and $Y_1$ and punctures the other inputs according to the puncturing pattern "110000" at initial transmission. However, the puncturer 516 outputs X and $Z_2$ and punctures the other bits according to the puncturing pattern "100001" at retransmission. As another example, if it is assumed that the puncturer 516 uses the puncturing pattern of Equation (2), the puncturer 516 outputs X and $Y_1$ and punctures the other inputs according to the puncturing pattern "110000" at initial transmission. However, the puncturer 516 outputs X and $Z_1$ and punctures the other bits according to the puncturing pattern "100010" at retransmission.

However, when using an R=⅓ code adopted in 3GPP, the channel coder can be implemented with the first channel coder 510 and the puncturer 516 of FIG. 5.

Figure 6:
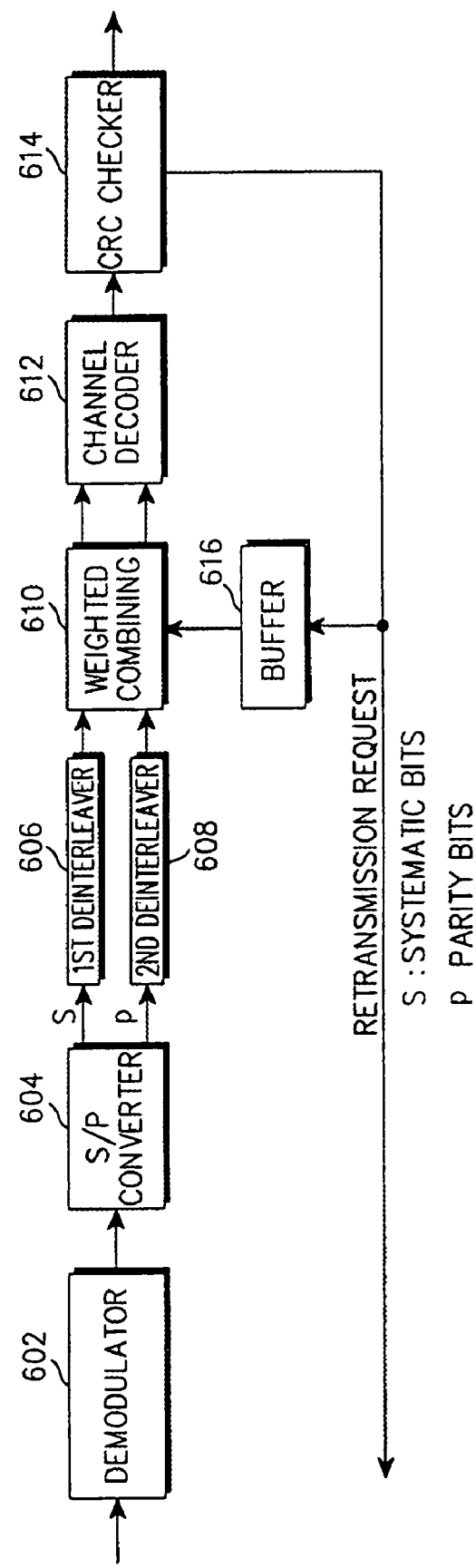
FIG. 6 illustrates a structure of a receiver corresponding to the transmitter of FIG. 4, according to an embodiment of the present invention.

FIG. 6 illustrates a structure of a receiver corresponding to the transmitter of FIG. 4, according to an embodiment of the present invention. Referring to FIG. 6, a demodulator 602 received data transmitted from the transmitter, and demodulates the received data according to a demodulation mode corresponding to the modulation mode used in the modulator 418 of the transmitter.

A serial-to-parallel (S/P) converter 604 receives the demodulated coded bits from the demodulator 602 in series, and then outputs the received coded bits in parallel. For example, if the modulator 418 of the transmitter uses the 16QAM modulation, the S/P converter 604 switches the received coded bits by 2 bits (in a unit of 2 bits), and outputs the first 2 bits to a first deinterleaver 606 and the next 2 bits to a second deinterleaver 608. In particular, when the modulator 418 of the transmitter uses the 16QAM modulation and the symmetrical coding rate ½, the S/P converter 604 outputs the systematic bits to the first deinterleaver 606 and the parity bits to the second deinterleaver 608. However, if the modulator 418 of the transmitter uses the 64QAM modulation and the symmetrical coding rate ½, the S/P converter 604 switches the received coded bits by 3 bits (in a unit of 3 bits), and outputs the first 3 bits to the first deinterleaver 606 and the next 3 bits to the second deinterleaver 608.

The first deinterleaver 606 and the second deinterleaver 608 receive the coded bits from the S/P converter 604, and perform deinterleaving on the received coded bits. Deinterleaving operations of the first deinterleaver 606 and the second deinterleaver 608 should correspond to interleaving operations performed by the first and second interleavers 410 and 412 of the transmitter. That is, the first deinterleaver 606 and the second deinterleaver 608 should previously recognize the interleaving pattern used by the first and second interleavers 410 and 412 of the transmitter, so an agreement on the interleaving pattern information should be previously made between the transmitter and the receiver. For example, the transmitter can previously provide the receiver with the interleaving pattern information as system information before call setup.

A weight-combiner 610 combines the initially transmitted systematic bits and parity bits with the retransmitted systematic bits and parity bits, respectively. The combining is performed on the same systematic bits and parity bits received at initial transmission and retransmission. Therefore, when CC is used as the H-ARQ, the systematic bits and the parity bits received at initial transmission are identical to those received at every retransmission, so the weight-combiner 610 summed-combines the systematic bits and the parity bits. In addition, the weight-combiner 610 performs combining by applying different weights according to whether the coded bits are mapped to the bit positions with higher reliability or the positions with lower reliability. That is, the weight-combiner 610 applies a higher (heavy) weight to the systematic bits or parity bits mapped to the bit positions with higher reliability, and a lower (light) weight to the systematic bits or parity bits mapped to the bit positions with lower reliability. As a result, the systematic bits or the parity bits mapped to the bit positions with higher reliability have larger weight than the systematic bits or the parity bits mapped to the bit positions with lower reliability. The weight-combiner 610 allocates the weights considering an error occurrence probability of the bits mapped to the bit positions with higher reliability and error occurrence probability of the bits mapped to the bit positions with lower reliability. For example, the weight-combiner 610 allocates a weight of 0.66 for the bits mapped to the bit positions with higher reliability and a weight of 0.34 for the bits mapped to the bit positions with lower reliability.

A channel decoder 612 receives coded bits comprised of the combined systematic bits and parity bits from the weight-combiner 610, and decodes the received coded bits according to a prescribed decoding technique. Here, the prescribed decoding technique is to receive systematic bits and parity bits and decode the systematic bits, and the prescribed decoding technique is determined by the coding technique of the transmitter.

A CRC checker 614 receives the decoded bits output from the channel decoder 612, and checks CRC added to the received bits to determine whether errors have occurred in the received bits. If it is determined that no error has occurred in the received bits, the CRC checker 614 outputs the received bits, and transmits ACK to the transmitter in acknowledgement of the received bits. However, if it is determined that errors have occurred in the received bits, the CRC checker 614 transmits NACK (Negative ACK) to the transmitter to request retransmission of the errored bits.

A buffer 616 buffers (temporarily stores) the systematic bits and the parity bits output from the first deinterleaver 606 and the second deinterleaver 608, and provides the stored systematic bits and parity bits to the weight-combiner 610 in response to the retransmission request from the CRC checker 614. This is to enable the weight-combiner 610 to weighted-combine the systematic bits and the parity bits output from the first deinterleaver 606 and the second deinterleaver 608 in response to the retransmission request. However, the buffer 616 is initialized upon receipt of ACK from the CRC checker 614, deleting the systematic bits and the parity bits stored therein.

Prior to a detailed description of operations of preferred embodiments, operating conditions of the embodiments will be described in brief.

A first embodiment of the present invention proposes a transmitter and a receiver supporting the SMP technique and the H-ARQ technique in a CDMA mobile communication system using a coding rate ½.

A second embodiment of the present invention proposes a transmitter and a receiver supporting the SMP technique and the H-ARQ technique in a CDMA mobile communication system using a coding rate ¾.

Further, the present invention will divide the H-ARQ type supported by the first and second embodiments, and provide separate embodiments supporting the divided H-ARQ types. In addition, the invention will provide three methods of deciding reliabilities for the coded bits to be transmitted at retransmission.

Now, operations of the preferred embodiments of the present invention will be described in detail with reference to accompanying drawings.

1. First Embodiment (with Coding Rate ½)

An operation of the first embodiment of the present invention will be described in detail herein below with reference to the accompanying drawings. First, it will be assumed that the first embodiment of the present invention uses the coding rate ½, uses CC and PIR as the H-ARQ type, and uses the puncturing pattern of Equation (1). In addition, the detailed description of the operation will be separately made for the different H-ARQ types, including CC, PIR and FIR.

1.1 CC (Chase Combining) Used as H-ARQ Type

First, an operation of transmitting data will be described with reference to the structure of the HSDPA(High Speed Downlink Packet Access) transmitter shown in FIG. 4.

The CRC part 402 adds CRC to transmission data, and the CRC-added data is coded with a prescribed code by the channel coder 404. That is, the channel coder 404 outputs systematic bits (S bits) which are actual information data bits, and parity bits (P bits) for error controlling the transmission data, through coding. The channel coder 404, using the symmetrical coding rate ½, outputs the S bits and the P bits at the same rate.

An operation of the channel coder 404 will be described in more detail with reference to FIG. 5. The CRC-added data source is output as the S bits X, and at the same time, provided to the first channel coder 510. The data source provided to the first channel coder 510 is coded into different P bits $Y_1$ and $Y_2$ at a prescribed coding rate. Further, the data source is interleaved by the interleaver 512 and then provided to the second channel coder 514. The interleaved data provided to the second channel coder 514 is output as other S bits X'. Further, the interleaved data provided to the second channel coder 514 is coded into different P bits $Z_1$ and $Z_2$ at a prescribed coding rate. The puncturer 516 punctures the S bits X and X', and the P bits $Y_1$, $Y_2$, $Z_1$ and $Z_2$ according to a prescribed puncturing pattern, and outputs final S bits and P bits at a desired coding rate. As stated before, if the H-ARQ type is CC, the puncturing pattern at initial transmission is identical to the puncturing pattern at retransmission. That is, when CC is used as the H-ARQ type, the bits transmitted at initial transmission are identical to those transmitted at retransmission. The puncturing pattern is either previously recognized by the puncturer 516, or provided from the outside. In FIG. 5, the channel coder is provided with the puncturing pattern from the outside.

The coded symbols comprised of the S bits and the P bits from the channel coder 404 are provided to the rate matcher 406. The rate matcher 406 subjects the coded bits to rate matching. Commonly, the rate matching is performed by repetition and puncturing operations on the coded bits, when a transport channel is subject to multiplexing or the output bits of the channel coder are not identical in number to the symbols transmitted over the air. The coded bits rate-matched by the rate matcher 406 are divided into S bits and P bits, and provided to the distributor 408. The S bits and the P bits provided to the distributor 408 are distributed to a plurality of interleavers. For example, when there exist two interleavers 410 and 412, the distributor 408 distributes the S bits and the P bits to be identical in number. That is, as the channel coder 404 uses the coding rate ½, the distributor 408 distributes the S bits to the first interleaver 410 and the P bits to the second interleaver 412.

The S bits and the P bits distributed by the distributor 408 are interleaved by the first interleaver 410 and the second interleaver 412, respectively. The interleaving pattern of the first interleaver 410 and the second interleaver 412 is previously determined, and the determined interleaving pattern information should also be recognized by the receiver.

The interleaved S bits and P bits from the first interleaver 410 and the second interleaver 412 are provided to the reliability decision part 414. The reliability decision part 414 decides reliabilities for the interleaved S bits and P bits. The decided reliabilities indicate reliabilities of the symbols to be mapped to specific symbols in the following stage of modulator 418. Here, the reliability decision part 414 should recognize the coding rate ½ previously defined to determine the reliabilities for the S bits and the P bits.

The reliability decision by the reliability decision part 414 can be performed in the following three methods.

Figure 7:
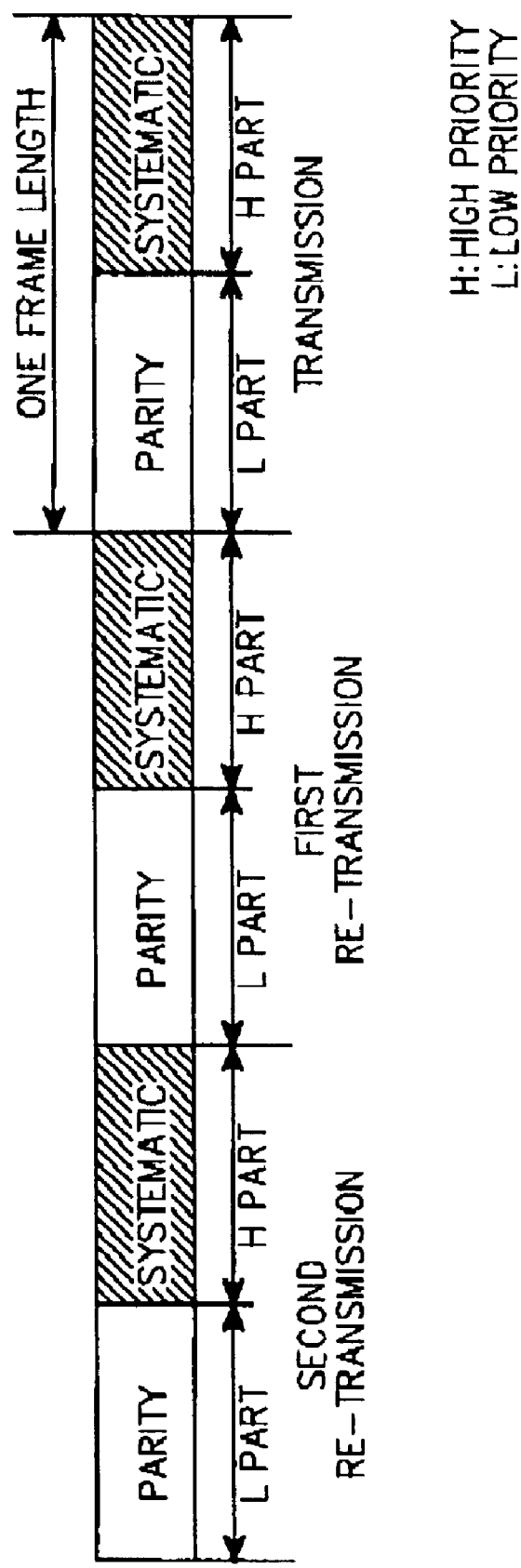
FIG. 7 illustrates an example of mapping systematic bits and parity bits for a coding rate ½ according to the present invention.

A first method is to transmit the same S bits and P bits at initial transmission and retransmission, and equally decide reliabilities of the S bits and the P bits transmitted at initial transmission and retransmission. That is, the reliability decision part 414 decides higher reliability for the S bits and lower reliability for the P bits, regardless of initial transmission or retransmission. FIG. 7 illustrates the S bits and the P bits with the reliabilities decided by this method, mapped to the corresponding symbols. As illustrated in FIG. 7, the S bits are mapped to the bit positions with higher reliability and the P bits are mapped to the bit positions with lower reliability, regardless of initial transmission or retransmission.

Figure 8:
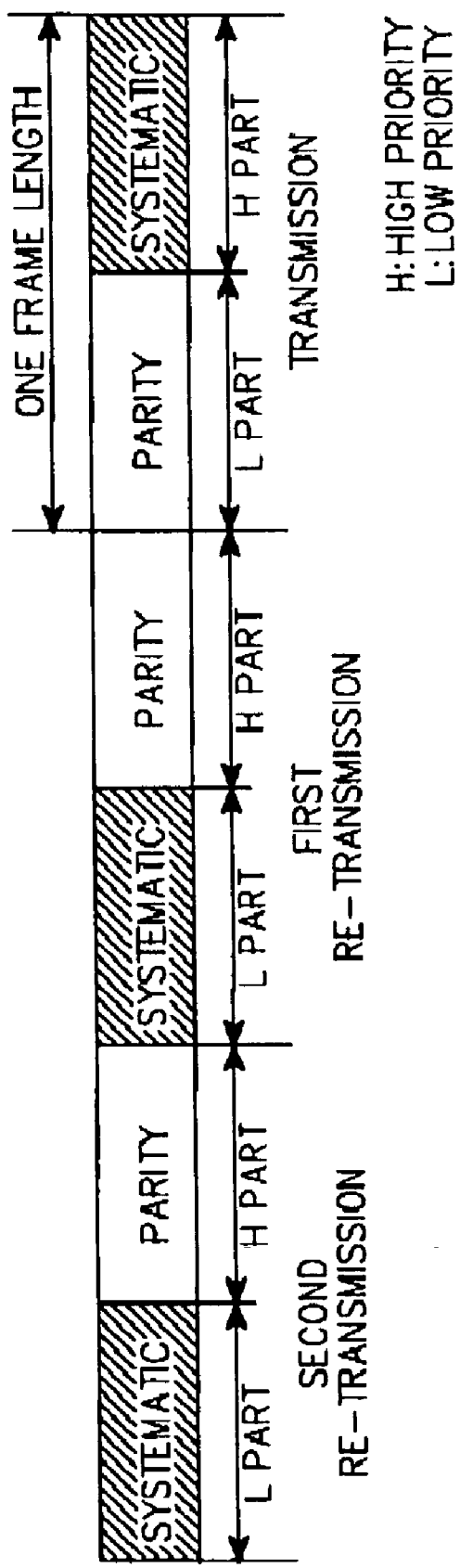
FIG. 8 illustrates another example of mapping systematic bits and parity bits for the coding rate ½ according to the present invention.

A second method is to transmit the same S bits and P bits at initial transmission and retransmission, and inversely decide reliabilities of the S bits and P bits transmitted at initial transmission and retransmission. That is, the reliability decision part 414 decides higher reliability for the S bits and lower reliability for the P bits at initial transmission. However, the reliability decision part 414 decides lower reliability for the S bits and higher reliability for the P bits at retransmissions, regardless of the number of retransmissions. FIG. 8 illustrates the S bits and the P bits with the reliabilities decided by this method, mapped to the corresponding symbols. As illustrated in FIG. 8, the S bits are mapped to the bit positions with higher reliability at initial transmission, but the P bits are mapped to the bit positions with higher reliability at retransmission. It is possible to maximize a coding gain by applying the second method to the reliability decision part 414.

Figure 9:
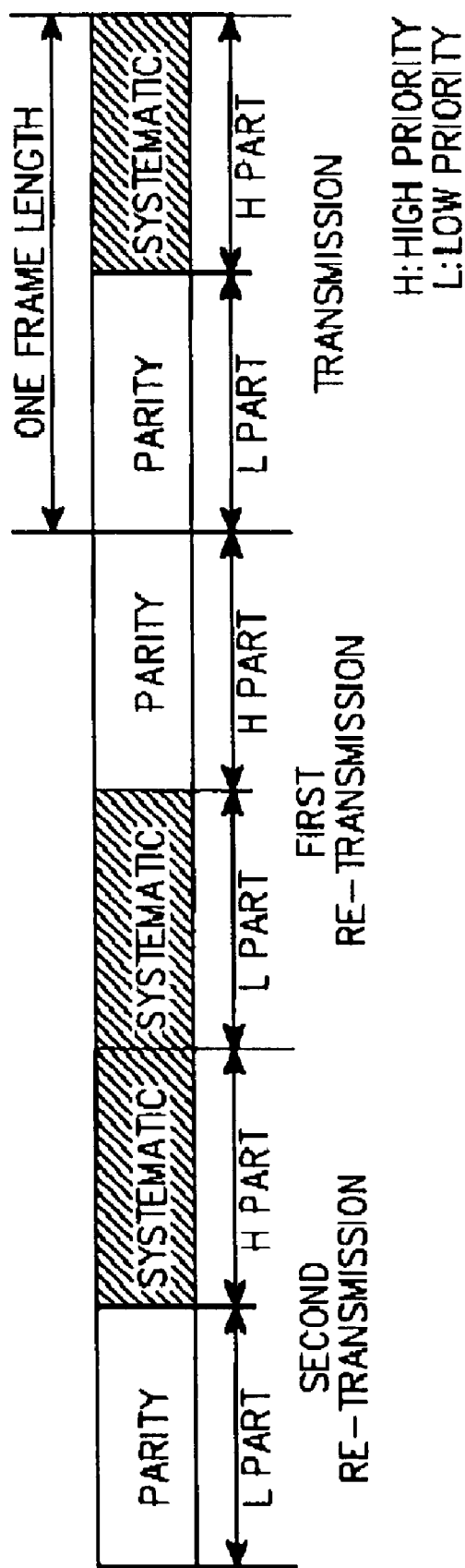
FIG. 9 illustrates a further example of mapping systematic bits and parity bits for the coding rate ½ according to the present invention.

A third method is to transmit the same S bits and P bits at initial transmission and retransmission, and alternately decide reliabilities of the S bits and P bits at every other retransmission. That is, the reliability decision part 414 decides higher reliability for the S bits and lower reliability for the P bits at initial transmission. However, the reliability decision part 414 decides lower reliability for the S bits and higher reliability for the P bits at first retransmission. Alternatively, the reliability decision part 414 decides higher reliability for the S bits and lower reliability for the P bits at second retransmission. FIG. 9 illustrates the S bits and the P bits with the reliabilities decided by this method, mapped to the corresponding symbols. As illustrated in FIG. 9, the S bits and the P bits are transmitted with different reliabilities at every other retransmission, so it is possible to increase decoding probability by averaging LLR values of the input bits to the channel coder 404.

Meanwhile, the reliability decision part 414 separately outputs the S bits and the P bits with the decided reliabilities. That is, the reliability decision part 414 outputs the S bits or P bits decided to have higher reliability through one output line, and the S bits or P bits decided to have lower reliability through another output line.

The S bits and the P bits output from the reliability decision part 414 through the different output lines are provided to the P/S converter 416 in parallel. The P/S converter 416 outputs the provided S bits and P bits in series according to the decided reliabilities. For example, the P/S converter 416 first outputs the S bits or P bits decided to have higher reliability, and then consecutively outputs the S bits or P bits decided to have lower reliability. Alternatively, the P/S converter 416 can first output the S bits or P bits decided to have lower reliability, and then consecutively output the S bits or P bits decided to have higher reliability.

Herein, the reliability decision part 414 and the P/S converter 416 are separately constructed. However, the P/S converter 416 can be removed. In this case, the reliability decision part 414 sequentially outputs the S bits or P bits according to the decided reliabilities.

The S bits and the P bits output in series from the P/S converter 416 are mapped to specific symbols in the modulator 418, and then transmitted to the receiver. For example, when using 16QAM modulation, the modulator 418 has the symbol reliability pattern [H,H,L,L]. Therefore, the modulator 418 maps the S bits or the P bits decided to have higher reliability to the bit positions "H" in the symbol reliability pattern, and maps the S bits or the P bits decided to have lower reliability to the bit positions "L" in the symbol reliability pattern. The modulator 418 has one of the mapping formats shown in FIGS. 7 to 9 according to the methods of deciding the reliabilities.

Next, an operation of receiving data will be describe with reference to the structure of the HSDPA receiver, shown in FIG. 6, corresponding to the transmitter. It should be noted that in describing the operation of receiving data, the S bits and the P bits refer to coded bits. Therefore, in the following description, the term "coded bits" will be construed as the S bits and the P bits as well.

The demodulator 602 receives data transmitted from the transmitter, and demodulates the received data into coded bits according to a demodulation mode corresponding to the modulation mode used in the modulator 418 of the transmitter. The S/P converter 604 receives the demodulated coded bits in series from the demodulator 602, and outputs the coded bits in parallel. For example, if the modulator 418 of the transmitter uses 16QAM modulation mode, the S/P converter 604 outputs first 2 bits to the first deinterleaver 606 and the next 2 bits to the second deinterleaver 608.

The first deinterleaver 606 and the second deinterleaver 608 receive the sorted coded bits from the S/P converter 604, and perform deinterleaving on the received coded bits. The deinterleaving operation by the first deinterleaver 606 and the second deinterleaver 608 should correspond to the interleaving operation performed by the interleavers 410 and 412 of the transmitter. That is, the first deinterleaver 606 and the second deinterleaver 608 perform deinterleaving according to the interleaving pattern used by the interleavers 410 and 412 of the transmitter.

The deinterleaved coded bits from the first deinterleaver 606 and the second deinterleaver 608 are provided to the weighted combiner 610, and subjected to weighted combining. That is, the weighted combiner 610 combines the coded bits received at initial transmission with the same coded bits received at retransmission. If there were several retransmissions, the weighted combiner 610 combines the coded bits received at each retransmission with the coded bits received at initial transmission. The combining, as stated above, is performed on the same coded bits. In performing the combining, the weighted combiner 610 applies weights in proportion to the reliabilities of the coded bits. That is, even for the same coded bits, the weighted combiner 610 applies a higher weight to the coded bits mapped to the bit positions with higher reliability and a lower weight to the coded bits mapped to the bit positions with lower reliability.

The weights $W_H$ and $W_L$ are applied considering error occurrence probability of the coded bits mapped to the bit positions with higher reliability and error occurrence probability of the coded bits mapped to the bit positions with lower reliability. For example, the weights $W_H$ and $W_L$ are defined as $$W_H = \frac{P_L}{P_L + P_H} \qquad \text{Equation (3)}$$

$$W_L = \frac{P_H}{P_L + P_H}$$

In Equation (3), $P_H$ represents error occurrence probability of the coded bits mapped to the bit positions with higher reliability, and $P_L$ represents error occurrence probability of the coded bits mapped to the bit positions with lower reliability. Further, $W_H$ represents a weight allocated to the coded bits mapped to the bit positions with higher reliability, and $W_L$ represents a weight allocated to the coded bits mapped to the bit positions with lower reliability.

Equation (4) below shows an example in which the weighted combiner 610 performs combining by applying the weights to the same coded bits received at initial transmission and retransmission. That is, it is possible to explain the weighted combining using Equation (4).

$$S_{com} = \frac{(S_{com}^L + S_{com}^H)}{N} \qquad \text{Equation (4)}$$

In Equation (4), N represents the total number of transmissions, and satisfies N=i+j. Further, $S_{com}^L$ represents a sum calculated by combining the coded bits $S^L$, transmitted i times, mapped to the bit positions with lower reliability with the weight $W_L$, and $S_{com}^H$ represents a sum calculated by combining the coded bits $S^H$, transmitted j times, mapped to the bit positions with higher reliability with the weight $W_H$.

$S_{com}^L$ and $S_{com}^H$ in Equation (4) can be defined as $$S_{com}^L = \sum_i S^L \cdot W_L \qquad \text{Equation (5)}$$

$$S_{com}^H = \sum_j S^H \cdot W_H \qquad \text{Equation (6)}$$

In order to perform weighted combining, the weighted combiner 610 should recognize the previously received coded bits. Therefore, the weighted combiner 610 is provided with the previously received coded bits from the buffer 616. The buffer 616 determines whether to store the previously received coded bits based on the error check results from the CRC checker 614. That is, the coded bits stored in the buffer 616 are the coded bits for which a retransmission request has been sent to the transmitter due to occurrence of errors. The weighted combiner 610 provides the weighted-combined coded bits to the channel decoder 612.

However, the weighted combiner 610 cannot perform weighed combining on the coded bits provided from the first deinterleaver 606 and the second deinterleaver 608, at initial transmission. Therefore, at initial transmission, the weight combiner 610 provides the intact coded bits from the first deinterleaver 606 and the second deinterleaver 608 to the channel decoder 612.

The channel decoder 612 decodes the coded bits provided from the weighted combiner 610 into information bits transmitted by the transmitter according to a prescribed decoding technique. Here, the prescribed decoding technique is to receive S bits and P bits, and decode the S bits, and the prescribed decoding technique is determined by the coding technique of the transmitter.

The CRC checker 614 receives the information bits decoded by the channel decoder 612, and determines whether errors have occurred in the received information bits, by checking CRC included in the information bits. If it is determined that errors have occurred in the information bits, the CRC checker 614 reports it to the upper layer, and requests retransmission of the corresponding information bits. However, if it is determined that no error has occurred in the information bits, the CRC checker 614 outputs the information bits, and then performs error check on the next information bits provided from the channel decoder 612.

Though not illustrated in FIG. 6, when the CRC checker 614 detects an error, the upper layer will transmit NACK to the transmitter for retransmission request. However, if the CRC checker 614 detects no error, the upper layer will transmit ACK to the transmitter in acknowledgement of the information bits. As mentioned above, when NACK is transmitted, the errored coded bits are stored in the buffer 616. However, when ACK is transmitted, the buffer 616 is initialized.

1.2 PIR (Partial Incremental Request) Used as H-ARQ Type

First, an operation of transmitting data will be described with reference to the structure of the HSDPA transmitter shown in FIG. 4.

The CRC part 402 adds CRC to transmission data, and the CRC-added data is coded with a prescribed code by the channel coder 404. That is, the channel coder 404 outputs systematic bits (S bits) which are actual transmission data, and parity bits (P bits) for error controlling the transmission data, through coding. The channel coder 404, using the symmetrical coding rate ½, outputs the S bits and the P bits at the same rate. An operation of the channel coder 404 is performed in the same manner as performed when CC is used as the H-ARQ type. However, the puncturing pattern for the puncturer 516 of the channel coder 404 should be newly defined. The puncturing pattern for the PIR should be defined such that the same bits are transmitted for the S bits both at initial transmission and retransmission and the different bits from the previously transmitted bits are transmitted for the P bits at initial transmission and retransmission. When the PIR is used, the puncturer 516 uses the puncturing patterns of Equations (1) and (2).

The S bits and the P bits output from the channel coder 404 are provided to the reliability decision part 414 through the rate matcher 406, the distributor 408, the first interleaver 410 and the second interleaver 412, as done when the CC is used. The reliability decision part 414 decides reliabilities of the S bits and P bits in the above three methods, and maps the reliabilities to the corresponding symbols before transmission to the receiver. That is, when the PIR is used as the H-ARQ type, the transmitter transmits data in the same way as performed when the CC is used as the H-ARQ type, except that the channel coder 404 has a different puncturing pattern.

Next, an operation of receiving data will be described with reference to the structure of the HSDPA receiver, shown in FIG. 6, corresponding to the transmitter. It should be noted that in describing the operation of receiving data, the S bits and the P bits refer to coded bits. Therefore, in the following description, the term "coded bits" will be construed as the S bits and the P bits as well.

An operation of processing the data received through the demodulator 602, the S/P converter 604 and the first deinterleaver 606 or the second deinterleaver 608 is performed in the same method as done when the CC is used as the H-ARQ type. However, when the PIR is used as the H-ARQ type, the weighted combiner 610 should perform weighted combining considering whether the P bits of the deinterleaved coded symbols provided from the first deinterleaver 606 or the second deinterleaver 608 are identical to the P bits of the previously deinterleaved coded symbols, at retransmission. This is because the puncturing pattern used for the CC is different from the puncturing pattern used for the PIR. That is, when the PIR is used as the H-ARQ type, the same S bits are transmitted at both initial transmission and retransmission, whereas the same P bits are not transmitted at the initial transmission and retransmission. Therefore, in the case of the S bits, the weighted combiner 610 weighed-combines the S bits transmitted at initial transmission with the S bits transmitted at every retransmission. However, in the case of the P bits, the weighted combiner 610 determines whether the P bits provided for retransmission are identical to the P bits transmitted at previous retransmissions including initial transmission, and performs weighed combining only when there exist the same P bits. That is, when the PIR is used as the H-ARQ type, one coded block is segmentally transmitted several times through initial transmission and retransmission. In this case, while the whole coded block is transmitted through initial transmission and retransmission, partial P bits may be identical at initial transmission and retransmission in a frame unit but the whole P bits are scarcely identical. Therefore, while the whole coded block is transmitted, the weighted combining can be performed on only some of the retransmitted P bits. Meanwhile, when retransmission is requested even after transmission of the whole coded block, it is necessary to retransmit the coded block from the beginning, so the weighted combining may be performed on the whole coded block of retransmitted P bits. However, in this case, it is necessary to store the previously received data in whole, resulting in a reduction in memory efficiency.

Meanwhile, the weighted combiner 610 allocates weights in the same manner as done when the CC is used as the H-ARQ type. A structure for decoding the output of the weighted combiner 610 is also identical to the above stated structure, so the detailed description thereof will not be provided.

1.3 FIR (Full Incremental Request) Used as H-ARQ Type

The CRC part 402 adds CRC to transmission data, and the CRC-added data is coded with a prescribed code by the channel coder 404. The channel coder 404 outputs the S bits and the P bits at the same rate according to the puncturing patterns of Equations (1) and (2) at initial transmission, and outputs only the P bits at retransmission. This can be achieved by adjusting the puncturing pattern of the puncturer 516 in the channel coder 404, and the puncturing pattern should be recognizable by both the transmitter and the receiver. When the FIR is used as the H-ARQ type, puncturing patterns $P_3$ and $P_4$ used for retransmission are defined as $$P_3 = \begin{bmatrix} 0 & 0 \\ 1 & 0 \\ 1 & 0 \\ 0 & 0 \\ 0 & 1 \\ 0 & 1 \end{bmatrix} \quad \text{Equation (7)}$$

$$P_4 = \begin{bmatrix} 0 & 0 \\ 0 & 1 \\ 0 & 1 \\ 0 & 0 \\ 1 & 0 \\ 1 & 0 \end{bmatrix} \quad \text{Equation (8)}$$

As shown in Equations (7) and (8), when the FIR is used as the H-ARQ type, the channel coder 404 has the puncturing patterns for puncturing the S bits and outputting only the P bits. For example, when the puncturing pattern of Equation (7) is applied to the channel coder 404 of FIG. 5, the channel coder 404 will output the coded bits $Y_1$, $Y_2$, $Z_1$ and $Z_2$.

Therefore, the channel coder 404 provides the coded bits comprised of the S bits and the P bits to the rate matcher 406 at initial transmission, but provides only the P bits to the rate matcher 406 at retransmission. The coded bits provided to the rate matcher 406, after being rate-matched, are provided to the reliability decision part 414 through the distributor 408 and the first interleaver 410 or the second interleaver 412.

The reliability decision part 414 decides reliabilities of the coded symbols from the first interleaver 410 and the second interleaver 412. When the FIR is used as the H-ARQ type, the S bits are transmitted only at initial transmission and not transmitted at retransmissions. Since only the P bits are transmitted at retransmissions, the reliability decision part 414 decides the reliabilities considering only the third one of the above-defined three methods. That is, it is preferable to transmit all the P bits with higher reliability instead of transmitting a specific P bit with higher reliability. Therefore, the reliability decision part 414 decides higher reliability for the S bits and lower reliability for the P bits at initial transmission. However, at retransmissions, the reliability decision part 414 divides 4 P bits to be transmitted by 2 bits, and alternately decides reliabilities for the two pairs of the divided bits. That is, the reliability decision part 414 decides lower reliability for the two bits previously decided to have higher reliability, and higher reliability for the two bits previously decided to have lower reliability.

For example, if the puncturing pattern of Equation (7) is used at retransmission, the reliability decision part 414 decides higher reliability for the coded bits $Y_1$ and $Y_2$ and lower reliability for the coded bits $Z_1$ and $Z_2$ at first retransmission, and decides lower reliability for the coded bits $Y_1$ and $Y_2$ and higher reliability for the coded bits $Z_1$ and $Z_2$ at second retransmission.

Meanwhile, the reliability decision part 414 separately outputs the bits decided to have higher reliability and the bits decided to have lower reliability. The P/S converter 416 receives in parallel the bits decided to have higher reliability and the bits decided to have lower reliability from the reliability decision part 414, and outputs the received bits in series. The S bits and the P bits output in series from the P/S converter 416 are provided to the modulator 418 where they are mapped to the bit positions corresponding to their reliabilities before being transmitted to the receiver.

Next, an operation of receiving data will be described with reference to the structure of the HSDPA receiver, shown in FIG. 6, corresponding to the transmitter of FIG. 4.

An operation of processing the data received through the demodulator 602, the S/P converter 604 and the first deinterleaver 606 or the second deinterleaver 608 is performed in the same method as done when the CC is used as the H-ARQ type. However, when the FIR is used as the H-ARQ type, the same P bits are received with different reliabilities at every other retransmission. Therefore, the weighted combiner 610 weight-combines the same P bits received at retransmission considering their reliabilities. The weighted combiner 610 performs weighted combining in the same method as used when the CC is used as the H-ARQ type. Meanwhile, a process for decoding the information bits output from the weighted combiner 610 is also identical to the above stated process, so the detailed description thereof will not be provided.

2. Second Embodiment (with Coding Rate ¾)

A detailed description of the second embodiment of the present invention will be made with reference to the accompanying drawings. First, an operation of transmitting data will be described with reference to the structure of the HSDPA transmitter shown in FIG. 4.

The CRC part 402 adds CRC to transmission data, and the CRC-added data is coded with a prescribed code by the channel coder 404. That is, the channel coder 404 outputs systematic bits (S bits) which are actual transmission data, and parity bits (P bits) for error controlling the transmission data, through coding. The channel coder 404, using the asymmetrical coding rate ¾, outputs 3 S bits and 1 P bit.

An operation of the channel coder 404 will be described in more detail with reference to FIG. 5. The CRC-added data source is output as the S bits X, and at the same time, provided to the first channel coder 510. The data source provided to the first channel coder 510 is coded into different P bits $Y_1$ and $Y_2$ at a prescribed coding rate. Further, the data source is interleaved by the interleaver 512 and then provided to the second channel coder 514. The interleaved data provided to the second channel coder 514 is output as other S bits X'. Further, the interleaved data provided to the second channel coder 514 is coded into different P bits $Z_1$ and $Z_2$ at a prescribed coding rate. The puncturer 516 punctures the S bits X and X', and the P bits $Y_1$, $Y_2$, $Z_1$ and $Z_2$ according to a prescribed puncturing pattern determined based on the coding rate ¾, and outputs final S bits and P bits. The puncturing pattern is either previously recognized by the puncturer 516, or provided from the outside. In FIG. 5, the channel coder is provided with the puncturing pattern from the outside.

The coded symbols comprised of the S bits and the P bits from the channel coder 404 are provided to the rate matcher 406 where they are subjected to rate matching. Commonly, the rate matching is performed by repetition and puncturing operations on the coded bits, when a transport channel is subject to multiplexing or the output bits of the channel coder are not identical in number to the symbols transmitted over the air. The coded bits rate-matched by the rate matcher 406 are divided into S bits and P bits, and provided to the distributor 408. The S bits and the P bits provided to the distributor 408 are distributed to a plurality of interleavers. For example, when there exist two interleavers 410 and 412, the distributor 408 distributes the S bits and the P bits to be identical in number. That is, as the channel coder 404 uses the coding rate ¾, the distributor 408 distributes 2 of the 3 S bits to the first interleaver 410, and distributes the remaining 1 S bit and the 1 P bit to the second interleaver 412.

The S bits and the P bits distributed by the distributor 408 are interleaved by the first interleaver 410 and the second interleaver 412. The interleaving pattern of the first interleaver 410 and the second interleaver 412 is previously determined, and the determined interleaving pattern information should also be recognized by the receiver.

The interleaved S bits and P bits from the first interleaver 410 and the second interleaver 412 are provided to the reliability decision part 414. The reliability decision part 414 decides reliabilities for the interleaved S bits and P bits. The decided reliabilities indicate reliabilities of the bit positions to be mapped to specific symbols in the following stage of modulator 418. Here, the reliability decision part 414 should recognize the coding rate ¾ previously defined to determine the reliabilities for the S bits and the P bits.

The reliability decision by the reliability decision part 414 can be performed in the following three methods.

Figure 10:
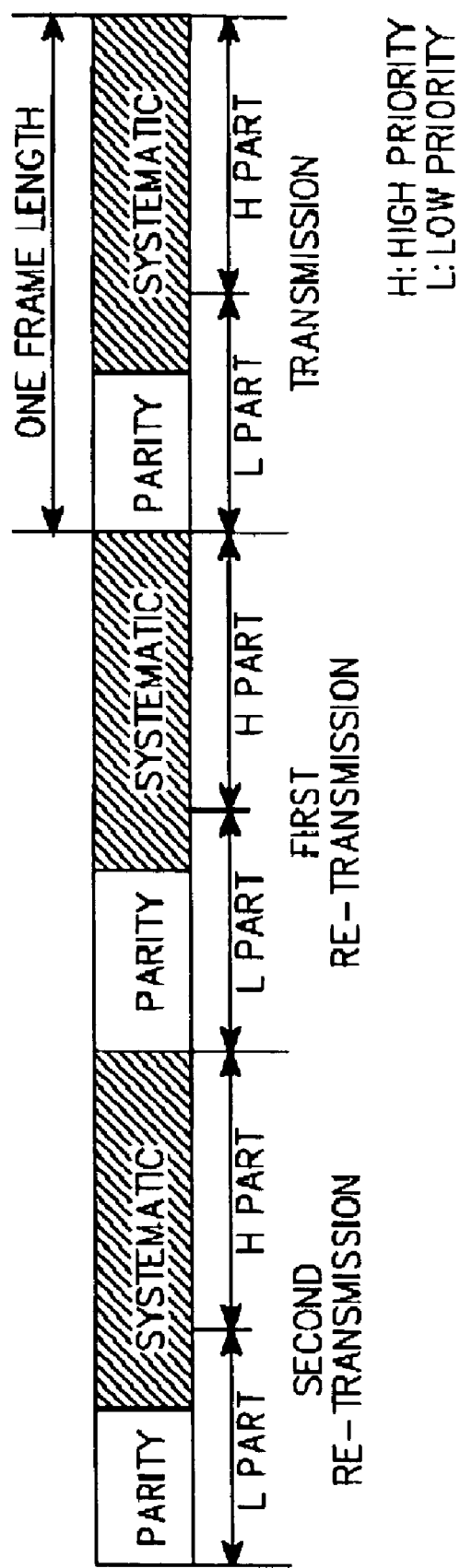
FIG. 10 illustrates an example of mapping systematic bits and parity bits for a coding rate ¾ according to the present invention.

A first method is to decide higher reliability for 2 S bits among the 3 S bits and decide lower reliability for the remaining 1 S bit and the P bit, at both initial transmission and retransmission. FIG. 10 illustrates the S bits and the P bits with the reliabilities decided by this method, mapped to the corresponding symbols. As illustrated in FIG. 10, the 2 S bits are mapped to the bit positions with higher reliability and the remaining 1 S bit and the P bit are mapped to the bit positions with lower reliability, regardless of initial transmission or retransmission. It is preferable to equally apply the 3 S bits in determining the S bit having the same reliability as the P bit at each retransmission. That is, there exist 6 possible combinations for determining higher reliability and lower reliability for the 3 S bits $S_1$, $S_2$ and $S_3$. Therefore, it is possible to transmit all the S bits with the same reliability by changing the S bit having the same reliability as the P bit at initial transmission and each of 5 retransmissions.

Figure 11:
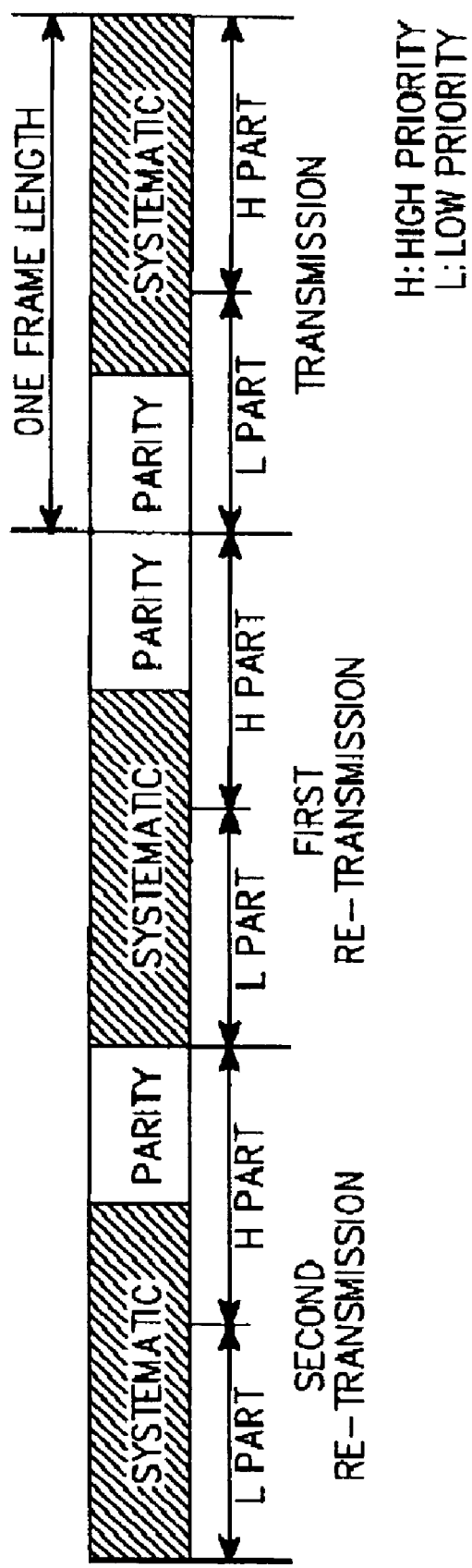
FIG. 11 illustrates another example of mapping systematic bits and parity bits for the coding rate ¾ according to the present invention.

A second method is to decide higher reliability for 2 S bits among the 3 S bits and decide lower reliability for the remaining 1 S bit and the P bit, at initial transmission. However, the reliability decision part 414 decides lower reliability for the 2 S bits among the 3 S bits and decide higher reliability for the remaining S bit and the P bits at retransmissions, regardless of the number of retransmissions. FIG. 11 illustrates the S bits and the P bits with the reliabilities decided by this method, mapped to the corresponding symbols. As illustrated in FIG. 11, the 2 S bits among the 3 bits are mapped to the bit positions with higher reliability at initial transmission, and the remaining 1 S bit and the P bit are mapped to the bit positions with lower reliability, at retransmissions. In this case also, it is preferable to decide the reliabilities such that the S bits each are decided to have the same reliability as the P bits in the same ratio.

Figure 12:
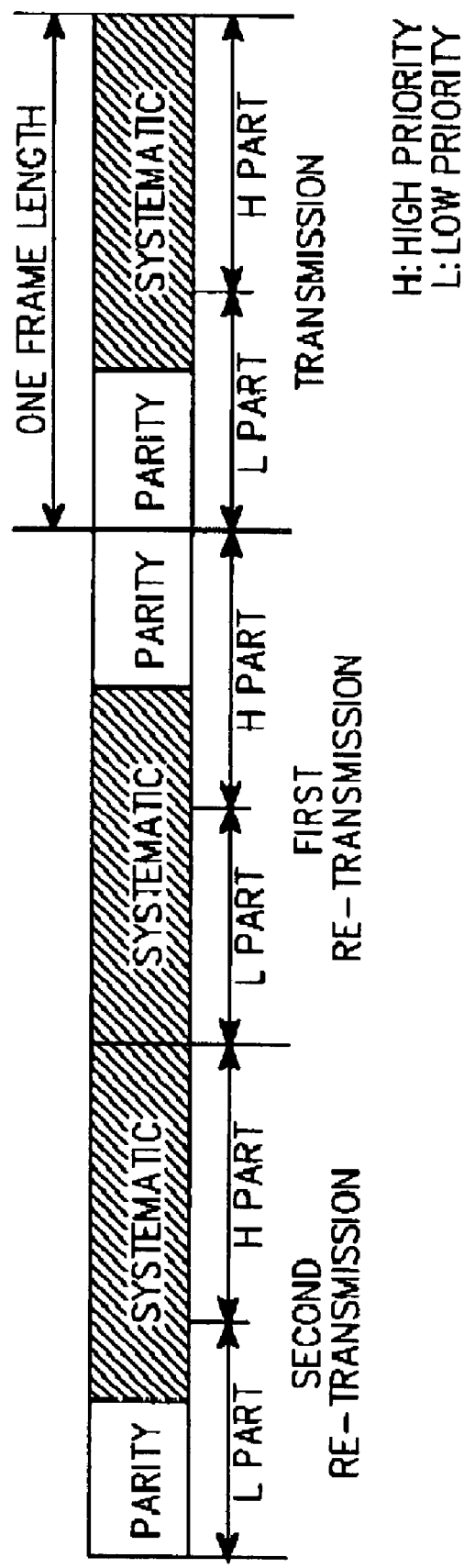
FIG. 12 illustrates a further example of mapping systematic bits and parity bits for the coding rate ¾ according to the present invention.

A third method is to decide lower reliability for 2 S bits among the 3 S bits and decide higher reliability for the remaining 1 S bit and the P bit, at first retransmission. However, the reliability decision part 414 decides higher reliability for the 2 S bits among the 3 S bits and decide lower reliability for the remaining S bit and the P bits, at the next retransmission. FIG. 12 illustrates the S bits and the P bits with the reliabilities decided by this method, mapped to the corresponding symbols. As illustrated in FIG. 12, the S bits and the P bits are transmitted with different reliabilities at every other retransmission, so it is possible to increase decoding probability by averaging LLR values of the input bits to the channel coder 404.

Meanwhile, the reliability decision part 414 separately outputs the S bits and the P bits according to the decided reliabilities. That is, the reliability decision part 414 outputs the S bits or P bits decided to have higher reliability through one output line, and the S bits or P bits decided to have lower reliability through another output line.

The S bits and the P bits output from the reliability decision part 414 through the different output lines are provided to the P/S converter 416 in parallel. The P/S converter 416 outputs the provided S bits and P bits in series according to the decided reliabilities. For example, the P/S converter 416 first outputs the S bits or P bits decided to have higher reliability, and then consecutively outputs the S bits or P bits decided to have lower reliability. Alternatively, the P/S converter 416 can first output the S bits or P bits decided to have lower reliability, and then consecutively output the S bits or P bits decided to have higher reliability.

Herein, the reliability decision part 414 and the P/S converter 416 are separately constructed. However, the P/S converter 416 can be removed. In this case, the reliability decision part 414 sequentially outputs the S bits or P bits according to the decided reliabilities.

The S bits and the P bits output in series from the P/S converter 416 are mapped to specific symbols in the modulator 418, and then transmitted to the receiver. For example, when using 16QAM modulation, the modulator 418 has the symbol reliability pattern [H,H,L,L]. Therefore, the modulator 418 maps the S bits or the P bits decided to have higher reliability to the bit positions "H" in the symbol reliability pattern, and maps the S bits or the P bits decided to have lower reliability to the bit positions "L" in the symbol reliability pattern. The modulator 418 has one of the mapping formats shown in FIGS. 10 to 12 according to the methods of deciding the reliabilities.

Next, an operation of receiving data will be described with reference to the structure of the HSDPA receiver, shown in FIG. 6, corresponding to the transmitter. It should be noted that in describing the operation of receiving data, the S bits and the P bits refer to coded bits. Therefore, in the following description, the term "coded bits" will be construed as the S bits and the P bits as well.

The demodulator 602 receives data transmitted from the transmitter, and demodulates the received data into coded bits according to a demodulation mode corresponding to the modulation mode used in the modulator 418 of the transmitter. The S/P converter 604 receives the demodulated coded bits in series from the demodulator 602, and outputs the coded bits in parallel. For example, if the modulator 418 of the transmitter uses 16QAM modulation mode, the S/P converter 604 outputs first 2 bits to the first deinterleaver 606 and the next 2 bits to the second deinterleaver 608.

The first deinterleaver 606 and the second deinterleaver 608 receive the sorted coded bits from the S/P converter 604, and perform deinterleaving on the received coded bits. The deinterleaving operation by the first deinterleaver 606 and the second deinterleaver 608 should correspond to the interleaving operation performed by the interleavers 410 and 412 of the transmitter. That is, the first deinterleaver 606 and the second deinterleaver 608 perform deinterleaving according to the interleaving pattern used by the interleavers 410 and 412 of the transmitter.

The deinterleaved coded bits from the first deinterleaver 606 and the second deinterleaver 608 are provided to the weight-combiner 610 where they are subjected to weighted combining. That is, the weight-combiner 610 combines the coded bits received at initial transmission with the same coded bits received at retransmission. If there were several retransmissions, the weight-combiner 610 combines the coded bits received at each retransmission with the coded bits received at initial transmission. The combining, as stated above, is performed on the same coded bits. In performing the combining, the weight-combiner 610 applies weights in proportion to the reliabilities of the coded bits. That is, even for the same coded bits, the weight-combiner 610 applies a higher weight to the coded bits mapped to the bit positions with higher reliability and a lower weight to the coded bits mapped to the bit positions with lower reliability.

In order to perform weighted combining, the weight-combiner 610 should recognize the previously received coded bits. Therefore, the weight-combiner 610 is provided with the previously received coded bits from the buffer 616. The buffer 616 determines whether to store the previously received coded bits based on the error check results from the CRC checker 614. That is, the coded bits stored in the buffer 616 are the coded bits for which a retransmission request has been sent to the transmitter due to occurrence of errors. The weight-combiner 610 provides the weighted-combined coded bits to the channel decoder 612.

However, at initial transmission, the weight-combiner 610 cannot perform weighed combining on the coded bits provided from the first deinterleaver 606 and the second deinterleaver 608. Therefore, at initial transmission, the weight-combiner 610 provides the intact coded bits from the first deinterleaver 606 and the second deinterleaver 608 to the channel decoder 612.

The channel decoder 612 decodes the coded bits provided from the weight-combiner 610 into information bits transmitted by the transmitter according to a prescribed decoding technique. Here, the prescribed decoding technique is to receive S bits and P bit, and decode the S bits, and the prescribed decoding technique is determined by the coding technique of the transmitter.

The CRC checker 614 receives the information bits decoded by the channel decoder 612, and determines whether errors have occurred in the received information bits, by checking CRC included in the information bits. If it is determined that errors have occurred in the information bits, the CRC checker 614 reports it to the upper layer, and transmits NACK, a retransmission request for the corresponding information bits. However, if it is determined that no error has occurred in the information bits, the CRC checker 614 outputs the information bits, and then transmits ACK to the transmitter. When transmitting the NACK, the receiver stores the errored coded bits in the buffer 616. However, when transmitting the ACK, the receiver initializes the coded bits stored in the buffer 616.

Meanwhile, the combining technique according to the embodiment of the present invention can be omitted according to the system requirements, since the combining technique is an additional technique for obtaining a performance gain although the receiver can obtain a gain of system performance without applying weights according to the priority.

As described above, it is possible to obtain a coding gain and a diversity gain by mapping even the coded bits with higher priority to the bit positions with lower reliability, and to obtain excellent transmission efficiency by equalizing (averaging) LLR values of the input bits to the turbo decoder. The present invention can be applied to a transmission/reception apparatus in a wired or wireless communication system. Further, when used for the 3GPP HSDPA, the invention can contribute to an improvement in the entire system performance. That is, compared with the existing system, the novel system according to the present invention has a lower bit error rate, resulting in an increase in throughput.

While the invention has been shown and described with reference to a certain preferred embodiment thereof; it will be understood by those skilled in the art that various changes in form and details may be made therein without departing from the spirit and scope of the invention as defined by the appended claims.

What is claimed is:

1. A transmission apparatus in a CDMA (Code Division Multiple Access) mobile communication system, comprising:
    a turbo coder for receiving a stream of information bits, and generating an encoded bit stream;
    at least one interleaver for interleaving the encoded bits stream according to priority, the encoded bits stream including bits with higher priority and bits with lower priority, and for outputting the interleaved bits with higher priority and the interleaved bits with lower priority respectively; and
    a modulator for generating a modulation symbol consisting of a first bit part having a relatively high reliability and a second bit part having a relatively low reliability, wherein the modulator maps interleaved bits with higher priority to the second bit part and interleaved bits with lower priority to the first bit part in a retransmission case.

2. The apparatus as claimed in claim 1, wherein the total number of bits existing in the first bit part and the second bit part is determined by a modulation mode.

3. The apparatus as claimed in claim 1 wherein the bits with higher priority are systematic bits and the bits with lower priority are parity bits.

4. A method for data transmission in a CDMA (Code Division Multiple Access) mobile communication system, comprising the steps of:
    encoding a stream of information bits and generating an encoded bit stream;
    separating the encoded bits stream into bits with higher priority and bits with lower priority, and interleaving the bits with higher priority, and interleaving the bits with lower priority; and
    generating a modulation symbol consisting of a first bit part having a high reliability and a second bit part having a low reliability,
    wherein during retransmission the interleaved bits with higher priority are mapped to the second bit part and interleaved bits with lower priority are mapped to the first bit part.

5. The method as claimed in claim 4, wherein the bits with higher priority are systematic bits and the bits with lower priority are parity bits.

6. The method as claimed in claim 4, wherein the total number of bits existing in the first bit part and the second bit part is determined by a modulation mode.

7. A method for receiving data in a mobile communication system, comprising the steps of:
    demodulating modulation symbols and outputting a demodulated bits stream;
    separating the demodulated bits stream into bits with higher priority and bits with lower priority, and deinterleaving the bits with higher priority and the bits with lower priority respectively;
    combining the deinterleaved bits with higher priority or the deinterleaved bits with lower priority, and corresponding bits received at a previous transmission;
    decoding combined bits with higher priority and combined bits with lower priority,
    wherein bits in a first part of the modulation symbol are separated into the bits with higher priority and bits in a second part of the modulation symbol are separated into the bits with lower priority.

8. The method as claimed in claim 7, wherein the total number of bits existing in the first bit part and the second bit part is determined by a modulation mode.

9. The method as claimed in claim 7, wherein the bits with higher priority are systematic bits and the bits with lower priority are parity bits.

10. An apparatus for receiving data in a mobile communication system comprising:
    a demodulator for demodulating modulation symbols and outputting a demodulated bits stream;
    a buffer for temporarily storing coded bits received at a previous transmission
    at least one deinterleaver for deinterleaving the demodulated bits stream according to priority, the demodulated bits stream including bits with higher priority and bits with lower priority, and outputting the deinterleaved bits with higher priority and the deinterleaved bits with lower priority respectively;
    a combiner for combining the deinterleaved bits with higher priority or the deinterleaved bits with lower priority, and the corresponding coded bits received at the previous transmission;
    a decoder for decoding combined bits with higher priority and combined bits with lower priority,
    wherein bits in a first bit part of the modulation symbol are separated into the bits with higher priority and bits in a second bit part of the modulation symbol are separated into the bits with lower priority.

11. The apparatus as claimed in claim 10, wherein the total number of bits existing in the first bit part and the second bit part is determined by a modulation mode.

12. The apparatus as claimed in claim 10, wherein the bits with higher priority are systematic bits and the bits with lower priority are parity bits.

* * * * *